United States Patent [19]
Ishizuka et al.

[11] Patent Number: 5,245,285
[45] Date of Patent: Sep. 14, 1993

[54] PROBE FOR MAGNETIC RESONANCE INSPECTION APPARATUS

[75] Inventors: Toshihiro Ishizuka, Katsuta; Munetaka Tsuda, Mito; Masao Yabusaki, Katsuta; Yasuo Wada, Katsuta; Takayuki Shimizu, Katsuta, all of Japan

[73] Assignee: Hitachi, Ltd., Tokyo, Japan

[21] Appl. No.: 719,994

[22] Filed: Jun. 24, 1991

[30] Foreign Application Priority Data

Jun. 26, 1990 [JP] Japan ................ 2-168126

[51] Int. Cl.⁵ .......................... G01R 33/20
[52] U.S. Cl. .................................. 324/318
[58] Field of Search ............ 324/300, 307, 309, 318, 324/322; 333/219; 128/653.5

[56] References Cited

U.S. PATENT DOCUMENTS 4,825,163 4/1989 Yabusaki et al. ................ 324/318

FOREIGN PATENT DOCUMENTS 61230052 10/1988 Japan .

OTHER PUBLICATIONS

Journal of Magnetic Resonance 69, 236–242 (1986).
Journal of Magnetic Resonance 36, 447–471 (1979).

Primary Examiner—Michael J. Tokar
Attorney, Agent, or Firm—Antonelli, Terry, Stout & Kraus

[57] ABSTRACT

A quadrature detection device for magnetic resonance imaging includes a pair of probes each having a pair of first conductors with a vertical arm and wings formed at both ends of the vertical arm and guard rings disposed inside the wings to oppose them and predetermined capacitors. In each probe, the resonance characteristics of the probe has two peaks. Symmetry of the peak existing in the resonance frequency range is effected by spacing the peak existing in a frequency range other than the resonance frequency range apart from the former. Thus, uniformity of the resulting image can be improved. The drop of the Q value of the probe is prevented by shifting the former peak to a higher frequency range than the latter peak. Also, electric symmetry of the probe is maintained.

24 Claims, 7 Drawing Sheets

PROBE FOR MAGNETIC RESONANCE INSPECTION APPARATUS

BACKGROUND OF THE INVENTION

This invention relates to a probe for a magnetic resonance inspection apparatus.

A magnetic resonance inspection apparatus constituted by utilizing magnetic resonance imaging irradiates a radio frequency magnetic field so as to generate nuclear magnetic resonance at an arbitrary position inside a subject, and includes a probe for receiving the magnetic resonance signal generated inside the living body. In magnetic resonance imaging, efficiency of the probe and uniformity of the radio frequency magnetic field must be improved to increase measured image quality and to shorten the imaging time. A quadrature detection probe is known as one of the means for improving performance of the probe, as disclosed in "Journal of Magnetic Resonance", Vol. 69 (187), pp. 236-242. This probe will be referred to as the "QD probe" in this specification. The probe of this kind is also described in JP-A-61-230052.

FIG. 1 is a perspective view of this QD probe and FIG. 2 shows its wiring structure. As is obvious from these drawings, this QD probe comprises four I-shaped first conductors 100, 200, 300, 400, ring-like guard rings 11, 12, capacitors or capacitance elements 31-38, 41, 42, and power supply circuits 500, 600. The first conductors 100, 300 and the guard rings 11, 12 constitute a coil, that is, an induction element, and this coil has a parallel relation with predetermined capacitance elements. This induction element and the predetermined capacitance elements constitute one probe. On the other hand, the first conductors 200, 400 and the guard rings 11, 12 form another coil. This coil detects a signal whose phase deviates by 90° from the signal detected by the former coil. This coil, too, has a parallel relation with the predetermined capacitance elements and constitutes another probe.

When a subject such as a human head is inspected, a radio frequency magnetic field is applied generally to induce a maximum current in the probe and improve the signal-to-noise ratio (S/N). Thus, $$\omega = \gamma Ho$$

where $\omega$ is an angular velocity of the Larmor's precession, $\gamma$ is a gyromagnetic ratio and Ho is the intensity of a static magnetic field.

The intensity Ho is determined on the basis of this relation so that $\omega$ becomes the resonance frequency of the probe. For example, Ho is set to 21.1 MHz.

The studies conducted by the inventors of the present invention reveal that the resonance characteristics of the probe described above are such as shown in FIG. 3. In the diagram, an impedance $|Z|$ can be determined from the reactance component due to the coil and the capacitance elements and from the resistance component of a subject and the conductor itself in one probe. A first peak 74 represents resonance of the probe. A second peak 73 appears immediately adjacent to the first peak. Although the reasons why this second peak appears have not yet been clarified, it is assumed that another probe, that is, the probe whose phase deviates by 90° from that of the probe which measures the impedance, affects the impedance due to the structure of the QD probe shown in FIG. 1. The first peak 74 is affected by the second peak 73 and the waveform of the first peak 74 becomes asymmetric with 21.1 MHz being the center.

When the first peak 74 undergoes deformation, the magnitude of the induced current which is distributed at frequencies near 21.1 MHz and detected on the basis of a gradient field produces a detection signal which is distorted due to deformation of the impedance.

SUMMARY OF THE INVENTION

It is therefore a first object of the present invention to make the first peak corresponding to the resonance frequency symmetric on both right and left sides and to correct frequency dependence of a detection signal to prevent the detection signal from distortion depending on the frequency.

To accomplish this object, the separates the second peak 73 from the first peak 74 by reducing the frequency range in which the second peak 73 appears. This makes the first peak 74 symmetric on both right and left sides and improves frequency dependence of the detection signal.

According to the studies conducted by the present inventors, however, the Q value of the probe is reduced if the second peak 74 is shifted to a lower frequency range. When the Q value is reduced, the S/N ratio is undesirably affected.

It is therefore a second object of the present invention to improve frequency dependence of the detection signal while maintaining the Q value.

In order to accomplish this object, the present invention shifts the second peak to a higher frequency range than the first peak.

It is still another object of the present invention to improve an electric balance of a probe.

To accomplish this object, the present invention disposes capacitance elements at least between both ends of a first conductor in its axial direction and guard rings, and secures electric symmetry of the probe in the axial direction.

When unbalanced power is supplied to the probe, the ratio of the capacitance of the power supply side of the probe to the capacitance of the opposite side the probe is adjusted. This minimizes the sensitivity differences between the power supply side and the opposite side of the probe.

BRIEF DESCRIPTION DRAWINGS

DESCRIPTION OF THE PREFERRED EMBODIMENTS

Figure 1:
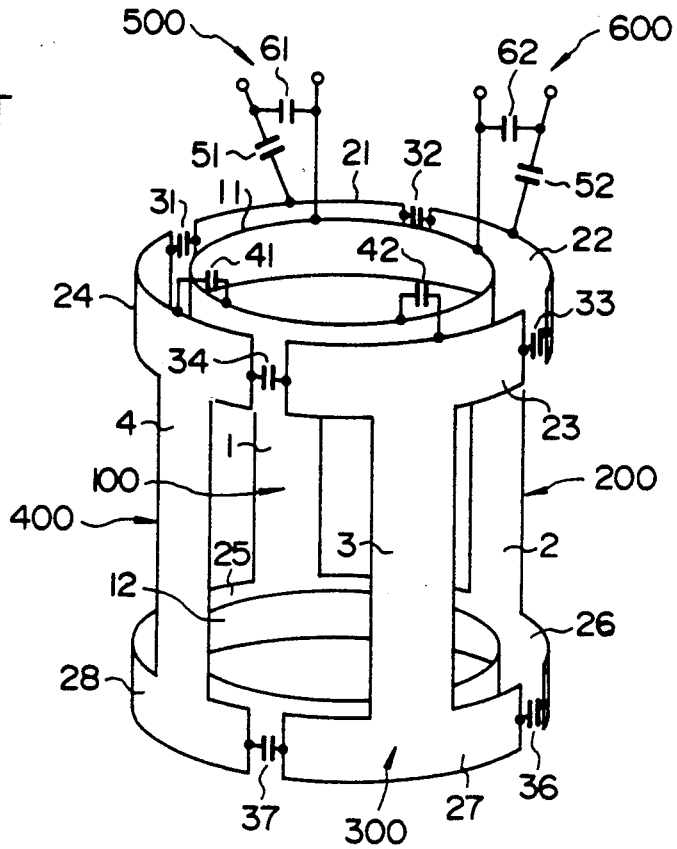
FIG. 1 is a perspective view showing a probe of the prior art.
Figure 2:
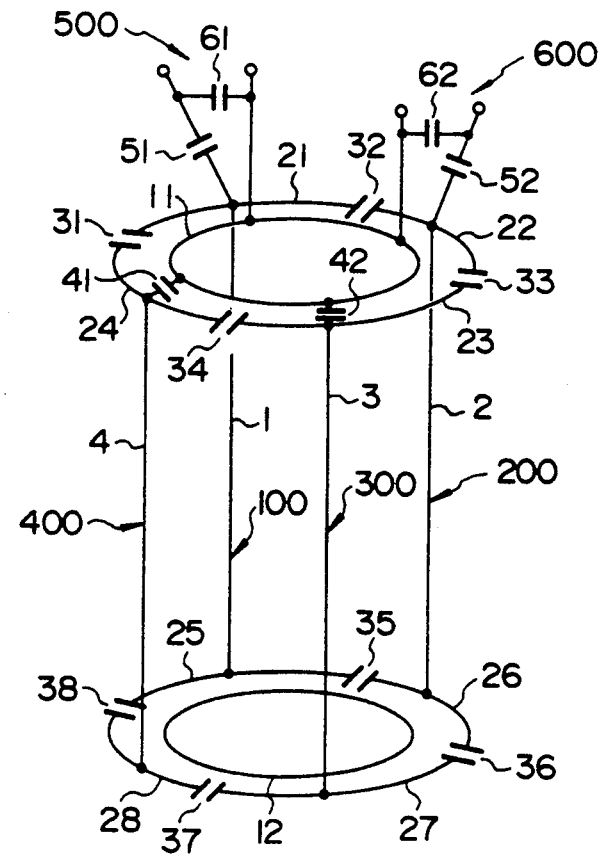
FIG. 2 is a schematic view showing a wiring structure of the probe of the prior art.
Figure 3:
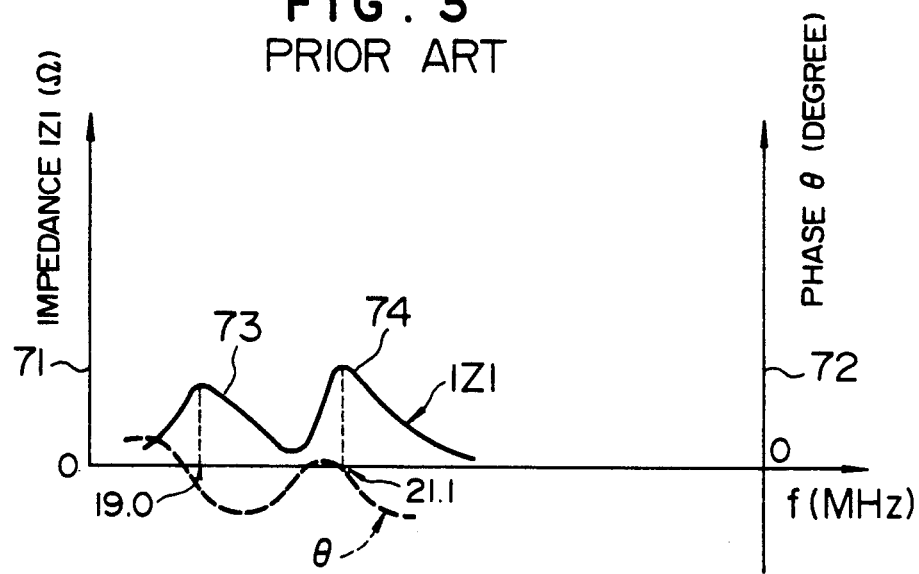
FIG. 3 is a waveform diagram showing the resonance characteristics of the probe of the prior art.
Figure 4:
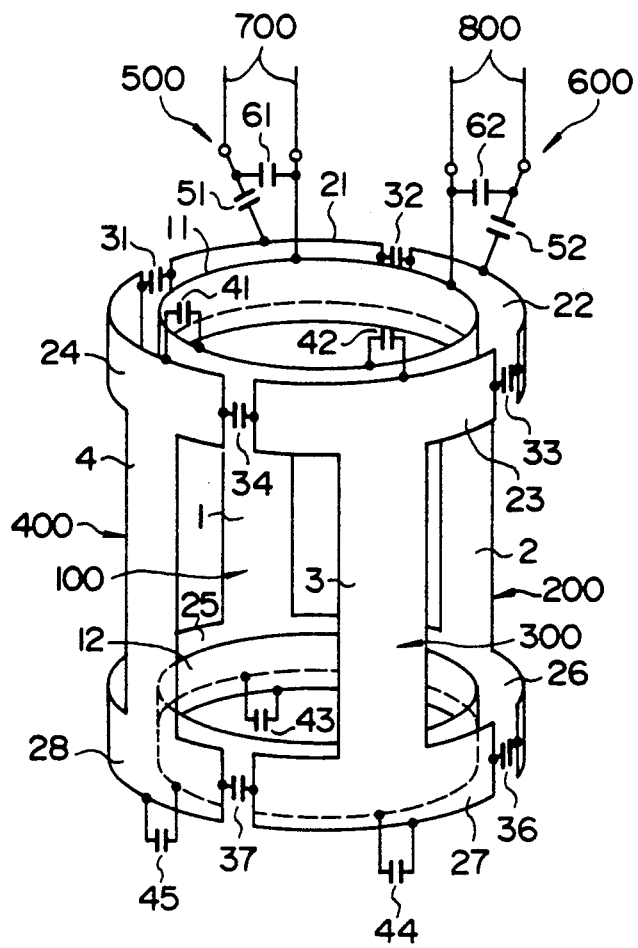
FIG. 4 is a perspective view showing a probe in accordance with an embodiment of the present invention.
Figure 5:
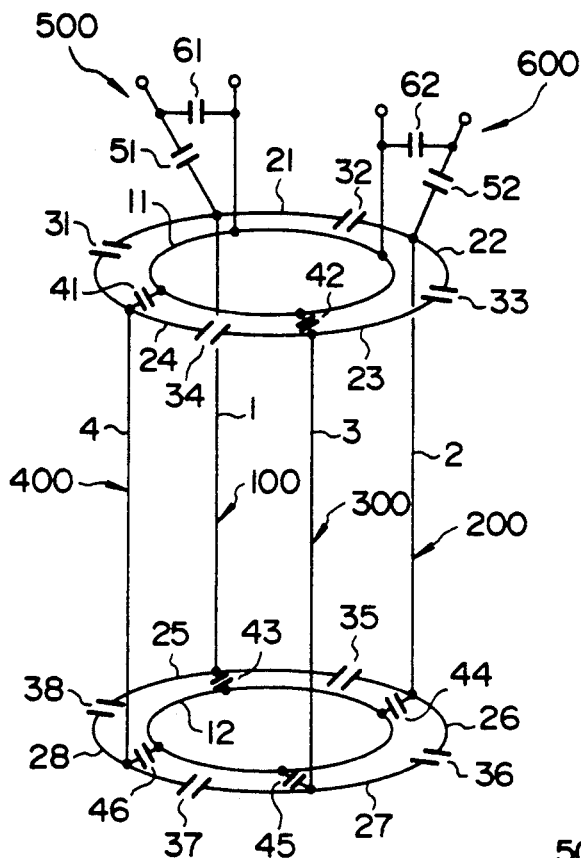
FIG. 5 is a schematic view showing a wiring structure of the probe shown in FIG. 4.

As shown in FIGS. 4 and 5, a probe in this embodiment is produced by adding capacitors 43-46 to the conventional probe shown in FIG. 1. The probe of this embodiment comprises first conductors 100, 200, 300, 400, guard rings 11, 12, capacitors or capacitance elements 31-38, 41, 42, and power supply circuits 500, 600.

The first conductor 100 comprises a vertical arm 1 of a belt-like conductor plate extending vertically in the drawings and wings 21, 25 expanding from the upper and lower ends of the vertical arm 1, and is substantially I-shaped when viewed from the front. Each of the other first conductors 200, 300, 400 comprises a vertical arm 2, 3, 4 and wings 22, 23, 24, 26, 27, 28, respectively. Each vertical arm 1, 2, 3, 4 of the first conductor is disposed in an axial direction of an imaginary cylinder surface in such a manner as to extend along this cylinder surface and moreover, equidistantly in the peripheral direction of the imaginary cylinder surface. The wings are disposed in the peripheral direction of the imaginary cylinder surface.

Each guard ring 11, 12 is a ring-like conductor plate. Ring 11 is disposed inside the wings 21, 22, 23, 24 ring 18 is disposed and inside the wings 25, 26, 27, 28. The enters of rings 11 and 12 are aligned with the center axis of the imaginary cylinder surface.

Each capacitance element comprises a first capacitor 31-38 disposed between the wings and a second capacitor 41-46 disposed between each first conductor and each guard ring.

Figure 6:
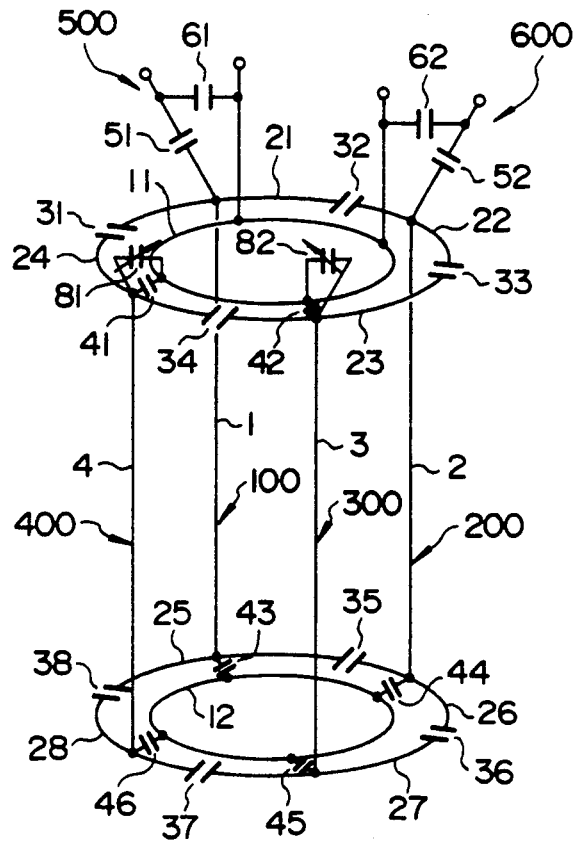
FIGS. 6 and 7 are perspective views each showing the probe in accordance with another embodiment of the present invention.
Figure 7:
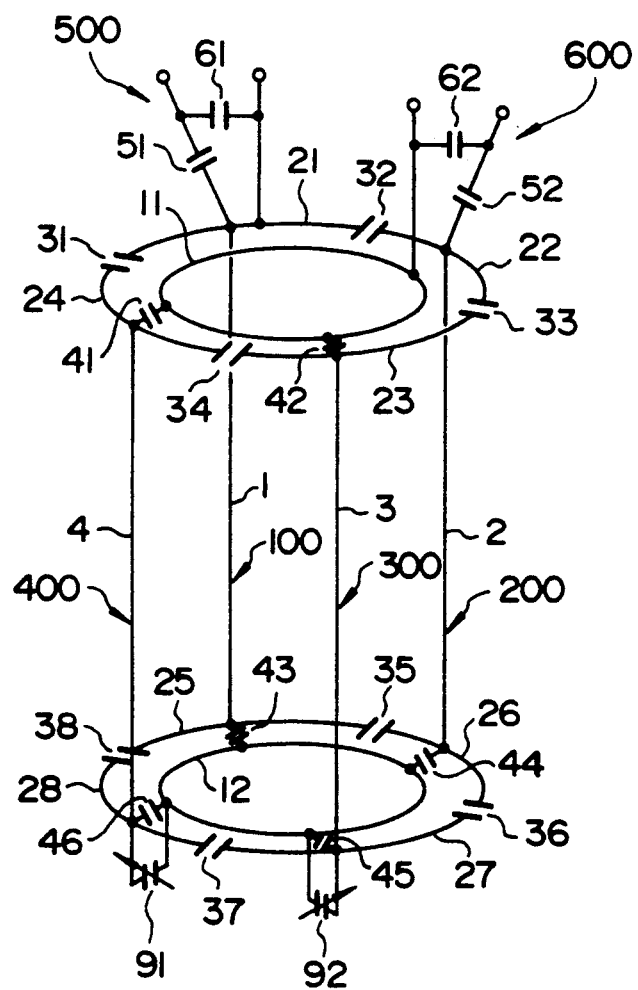

The first conductors 100 and 300 and the guard rings 11 and 12, that oppose one another, respectively, constitute one induction element. This induction element is connected in parallel with a predetermined capacitance element and form one probe. Similarly, the first conductors 200 and 400 and the guard rings 11 and 12 form another induction element and the resulting induction element and another predetermined capacitor form another probe. These two probes detect those signals whose phases deviate by 90° from each other. The resonance frequency of each probe is adjusted by regulating the capacitance element. In order to make fine adjustment of the resonance frequency, variable capacitors 81, 82, 91, 92 are preferably added to the capacitors 41, 42, 45, 46, respectively, as shown in FIGS. 6 and 7. A trimmer capacitor, for example, is used as the variable capacitor. One variable capacitance element can be used in place of the parallel circuit of the fixed capacitance element and the variable capacitance element used in the embodiment shown in the drawings.

A series circuit (power supply circuit) 500 composed of the capacitors 51 and 61 and another series circuit 600 composed of the capacitors 52 and 62 are interposed between the first conductor 100 and the guard ring 11 and between the first conductor 200 and the guard ring 11 constituting another probe, respectively. The combined capacitance of the capacitors 51 and 61 and that of the capacitors 52 and 62 are designed to be equal to the combined capacitances of the capacitors 41-46, respectively. In each circuit, a transmitter/receiver, not shown, is connected to both ends of the capacitors 61, 62, respectively, through the power supply lines 700, 800.

Figure 8:
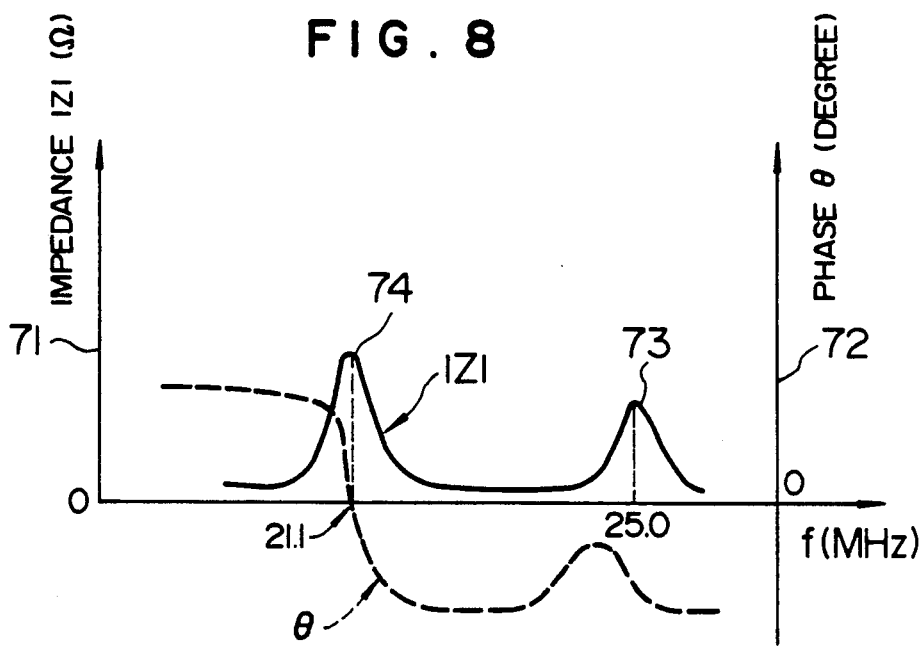
FIG. 8 is a waveform diagram showing the resonance characteristics of the probe of the present invention.

FIG. 8 shows the resonance characteristics of the probe having such a structure. As can be seen clearly from the diagram, the second peak 73 of the probe of this embodiment shifts to a higher frequency range than the first peak 74 and a large frequency difference exists between these peaks. The first peak 74 maintains its height (Q value) and symmetry.

Figure 10:
FIG. 10 is a photo showing an image taken in the embodiment of the invention.

FIG. 10 shows a tomogram of a phantom taken by the probe shown in FIG. 4. In the tomogram, line in the horizontal direction is the cursor that represents the position of measurement of the signal intensity. The profile of the signal at that position is represented by wave line in the tomogram. The probe of this embodiment can provide a uniform image not only from the image of the phantom but also from this signal profile.

Figure 11:
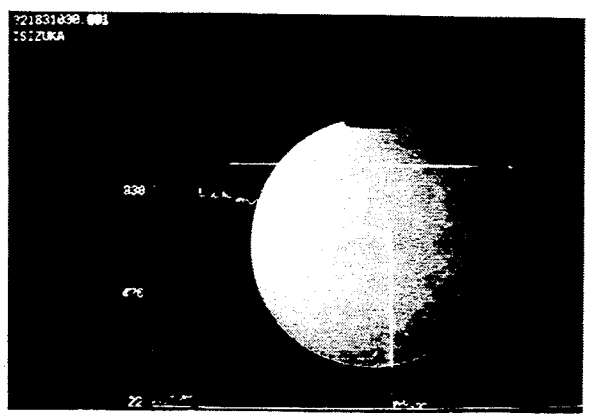
FIG. 11 is a photo showing an image taken in a comparative example.

FIG. 11 shows the image and signal profile when the phantom is tomographed using the probe shown in FIG. 1 under the same condition as described above. The signal profile deviates more greatly to the left side from the cursor. It can be understood from FIG. 11 that the image becomes non-uniform by use of the conventional probe.

In contrast with the probe shown in FIG. 1, the probe of this embodiment includes also the capacitance elements 43-46 between the wings 25-28 and the guard ring 12 of the inventive arrangement. Accordingly, electric symmetry of the probe in its axial direction is improved.

In the unbalanced power supply system shown in FIG. 4, power is supplied in parallel to the capacitors 61 and 62 (See Journal of Magnetic Resonance 36, 447–451 (1979).) The characteristic impedance of power supply cables 700, 800 at this time is 25 Ω when a ratrace circuit, is used and its characteristic impedance is 50 Ω at the time of normal power supply. Accordingly, electric asymmetry appears between the first conductors 100 and 300 and between 200 and 400 in each of the probes.

Figure 9:
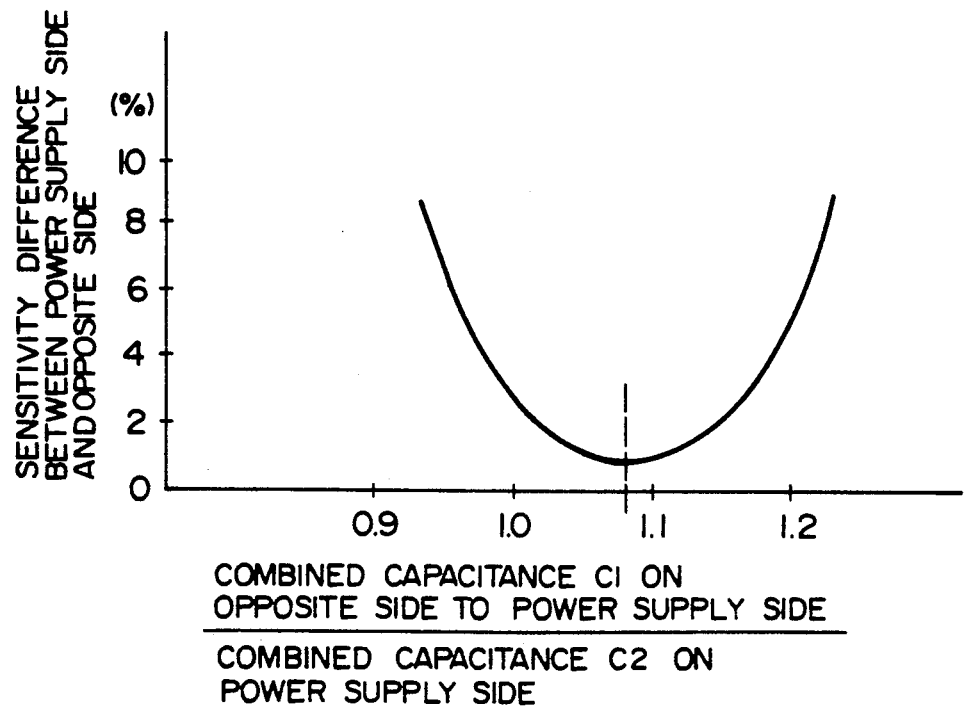
FIG. 9 is a graph showing the relation between the ratio of a combined capacitance on the opposite side to a power supply side to the combined capacitance on the power supply side and a sensitivity.

To solve this problem, the electrostatic capacitance of the capacitors 41-46, 51 and 61, and 52 and 62, is adjusted. The ratio of the combined capacitance of the capacitors 51, 61, 52, 62, 41 and 42 on the power supply side to the combined capacitance of the capacitors 43, 44, 45, and 46 on the opposite side to the power supply side is changed. FIG. 9 shows the difference of the sensitivity of the probe when the ratio of the combined capacitance C2 on the power supply side to the combined capacitance C1 on the opposite side is changed.

It is found from FIG. 9 that C1/C2 is preferably slightly greater than 1 and that the ratio is preferably from 1.05 to 1.11 and more preferably, 1.08.

Figure 12:
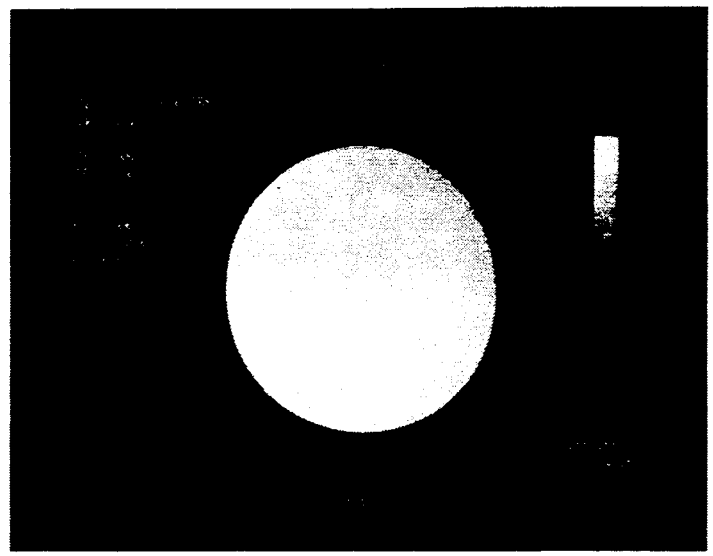
FIG. 12 is a photo showing an image taken in the other embodiment of the present invention.
Figure 13:
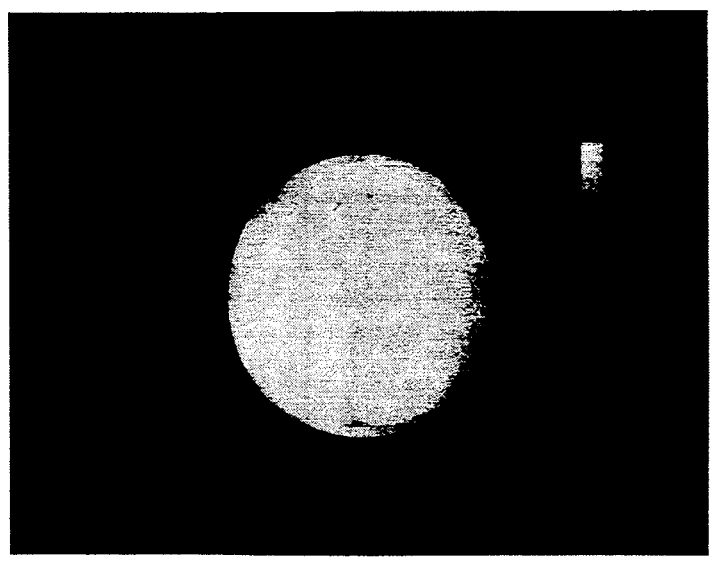
FIG. 13 is a photo showing an image taken in a comparative example.

FIG. 12 shows the image and signal profile when the phantom is tomographed with the probe having the ratio of 1.08. FIG. 13 shows the one when the ratio of the probe is 1.00. It can be understood from the Figs. that the former probe provides a more uniform image than the latter probe.

We claim:

1. A probe for a magnetic resonance inspection apparatus comprising:
   a plurality of first conductors, each comprising a vertical arm of a belt-like conductor formed in an axial direction of an imaginary cylinder surface and wings of a conductor plate connected to both ends of said vertical arm and formed in a peripheral direction of said imaginary cylinder surface;

first and second guard rings, each comprising a ring-like conductor plate formed along the inner peripheral surface of said wings;

a pair of said first conductors and said first and second guard rings forming together an induction element;

first capacitance elements positioned between said wings; and second capacitance elements positioned between a center region of a top end of said first conductors and said first guard ring and between a center region of a bottom end of said first conductors and said second guard ring.

2. A probe for a magnetic resonance inspection apparatus according to claim 1, wherein said first peak and said second peak are spaced apart from each other by at least 2 MHz.

3. A probe for a magnetic resonance inspection apparatus according to claim 2, wherein said second peak is at a higher frequency than said first peak.

4. A probe for a magnetic resonance inspection apparatus according to claim 3, wherein a gap adjustment between said two peaks is effected by adjusting said capacitance elements.

5. A probe for a magnetic resonance inspection apparatus according to claim 3, wherein a gap adjustment between said two peaks is effected by adjusting the size of said arms and/or said wings to adjust the inductance of said induction element.

6. A probe for a magnetic resonance inspection apparatus according to claim 3, wherein said first capacitance elements are disposed between a pair of said wings adjacent to each other in the peripheral direction of said imaginary cylinder surface.

7. A probe for a magnetic resonance inspection apparatus according to claim 6, wherein at least one of said first and second capacitance elements is a variable capacitance.

8. A probe for a magnetic resonance inspection apparatus according to claim 7, wherein at least one of said first and second capacitance elements is made a variable capacitance by a parallel circuit of a fixed capacitance element and a variable capacitance element.

9. A probe for a magnetic resonance inspection apparatus according to claim 6, wherein among said second capacitance elements, said second capacitance element disposed at one of the ends of said first conductor is a variable capacitance.

10. A probe for a magnetic resonance inspection apparatus according to claim 9, wherein said second capacitance element includes a variable capacitance parallel circuit having a fixed capacitance element and a variable capacitance element.

11. A probe for a magnetic resonance inspection apparatus comprising:

first conductors, each comprising a vertical arm of a belt-like conductor formed in an axial direction of an imaginary cylinder surface and wings of a conductor plate connected to both ends of said vertical arm and formed in a peripheral direction of said imaginary cylinder surface;

guard rings, each comprising a ring-like conductor plate formed along the inner peripheral surface of said wings;

a pair of said first conductors and said guard rings forming together an induction element; and capacitance elements disposed at least between a center region of both ends of said first conductors in said axial direction and said guard rings to secure electric symmetry of said induction element in the axial direction.

12. A probe for a magnetic resonance inspection apparatus according to claim 11, wherein an impedance characteristic of said probe has a second peak in a frequency range other than a resonance frequency thereof, and the peak of the resonance frequency or a first peak, and said second peak are spaced apart by a gap such that said first peak is not affected substantially by said second peak.

13. A probe for a magnetic resonance inspection apparatus according to claim 11, which further comprises means for supplying power to said probe under an unbalanced state, wherein a reactance of said probe is different between its power supply side and the opposite side.

14. A probe for a magnetic resonance inspection apparatus according to claim 13, wherein the impedance of said probe has a second peak in a frequency range other than a resonance frequency thereof, and the peak of the resonance frequency or a first peak, and said second peak are spaced apart by a gap such that said first peak is not affected substantially by said second peak.

15. A probe for a magnetic resonance inspection apparatus according to claim 13, which further comprises means for supplying power to said probe under an unbalanced state, and wherein the combined capacitance of said capacitance elements on the power supply side is smaller than that on the opposite side.

16. A probe for a magnetic resonance inspection apparatus according to claim 15, wherein a ratio (C1/C2) of the combined capacitance C1 of said capacitance elements on the opposite side to the power supply side to the combined capacitance C2 of said capacitance elements on the power supply side is from 1.05 to 1.11.

17. A probe for a magnetic resonance inspection apparatus according to claim 15, wherein a ratio (C1/C2) of the combined capacitance C1 of said capacitance elements on the opposite side to the power supply side to the combined capacitance C2 of said capacitance elements on the power supply side is 1.08.

18. A probe for a magnetic resonance inspection apparatus according to claim 17, wherein an impedance of said probe has a second peak in a frequency range other than a resonance frequency thereof, and the peak of the resonance frequency or a first peak, and said second peak are spaced apart by a gap such that said first peak is not affected substantially by said second peak.

19. A probe for a magnetic resonance inspection apparatus according to claim 1, wherein a resonance characteristic of said probe includes a first peak at a resonance frequency and a second peak in a frequency range spaced apart from said first peak so that said second peak does not substantially affect said first peak.

20. A probe for a magnetic resonance inspection apparatus according to claim 19, wherein said first peak is symmetrical.

21. A probe for a magnetic resonance inspection apparatus according to claim 19, wherein said first peak has a height or Q value which is substantially unaffected by said second peak.

22. A probe for a magnetic resonance inspection apparatus according to claim 1, wherein a resonance characteristic of said probe includes a symmetric peak.

23. A magnetic resonance inspection apparatus comprising the probe as set forth in claim 1.

24. A probe for a magnetic resonance inspection apparatus comprising:

first conductors, each comprising a vertical arm of a belt-like conductor formed in an axial direction of an imaginary cylinder surface, and wings of a conductor plate connected to both ends of said vertical arm and formed in a peripheral direction of said imaginary cylinder surface;

guard rings, each comprising a ring-like conductor plate formed along the inner peripheral surface of said wings;

a pair of said first conductors and said guard rings forming together an induction element;

first capacitance elements disposed between the wings; and second capacitance elements disposed between a center region at a top end and a bottom end of the respective conductors and the guard rings, wherein the probe has a resonance characteristic including a first peak and a second peak of impedance, the first peak is located at a resonance frequency of the probe, and the first and second peaks are spaced apart by a gap so that the first peak is not affected substantially by the second peak.

* * * * *